US006758647B2

(12) United States Patent
Kaji et al.

(10) Patent No.: US 6,758,647 B2
(45) Date of Patent: Jul. 6, 2004

(54) SYSTEM FOR PRODUCING WAFERS (75) Inventors: Tetsunori Kaji, Tokuyama (JP); Yoichi Uchimaki, Kudamatsu (JP); Yuko Egawa, Tokuyama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 211 days.

(21) Appl. No.: 10/083,378

(22) Filed: Feb. 27, 2002

(65) Prior Publication Data

US 2003/0113189 A1 Jun. 19, 2003

(30) Foreign Application Priority Data

Dec. 18, 2001 (JP) ........................................ 2001-384863

(51) Int. Cl.[7] .......................... B65G 1/00; B65G 49/05
(52) U.S. Cl. ...................... 414/217; 414/935; 414/222
(58) Field of Search ............................ 414/217, 222.01, 414/222.13, 226.01, 216, 935, 939, 222

(56) References Cited

U.S. PATENT DOCUMENTS

| 5,202,716 | A | * | 4/1993 | Tateyama et al. ............ 414/217 |
| 5,478,195 | A | * | 12/1995 | Usami ......................... 414/786 |
| 6,059,507 | A | * | 5/2000 | Adams ......................... 414/217 |
| 6,347,990 | B1 | * | 2/2002 | Sung et al. ................... 414/217 |

FOREIGN PATENT DOCUMENTS

JP     A-4-130618     1/1992

JP     A-7-122622     12/1995

OTHER PUBLICATIONS

Nikkei Micro–Device, Aug., 1992, pp. 66–74; and.
Nikkei Micro–Device, Aug., 1992, pp. 33–40. (Both not translated).

* cited by examiner

Primary Examiner—Eileen D. Lillis
Assistant Examiner—R. B. Johnson
(74) Attorney, Agent, or Firm—Antonelli, Terry, Stout & Kraus, LLP

(57) ABSTRACT

A system and method of manufacturing wafers are provided suitable for a semiconductor manufacturing system and a method thereof capable of shortening the processing period composed of a series of processes applied to objects to be processed, mainly carry out processes and conveyance peace by peace, and which can manufacture even various kings of products. The system is provided with a plurality of processing units each having therein a conveying mechanism, and is provided therein with a conveyer device for conveying the objects to be processed to the processing units. Further, the conveyer device includes loader conveying means which is laid along object transferring ports of the plurality of processing units across the object transferring ports of not less than two of the processing units, and a running robot which runs across not less than two of the object transferring ports, and a transferring robot for transferring the objects to be processed from the running robot to the processing units through the transferring ports, are arranged in the loader means. The loader means is shielded and provided with a purifying device so as to define an atmospheric pressure space conveying path.

7 Claims, 10 Drawing Sheets

SYSTEM FOR PRODUCING WAFERS

BACKGROUND OF THE INVENTION

1. Field of the Invention

The present invention relates to a wafer manufacturing system and a wafer manufacturing method, which can cope with a process module for processing an object to be processed (which will be hereinafter referred to "wafer") such as a semiconductor substrate, a liquid crystal substrate or a component substrate.

2. Related Art

Conventionally, as disclosed in, for example, "Operation Of LSI Production System Which Can Reduce Investment For Development and Cope With Variety Of Needs", Nikkei Micro-Device, August, 1992 Pages 66–74, the conveyance of an object to be processed among a plurality of processing units, have carried out such a manner that a plurality of wafers, that is, the so-called lot, as a unit, are conveyed in a batch. As far as the wafers are processed in a batch, a processing time corresponding to a number of wafers in a lot, is required in order to process the lot, and accordingly, the waiting time to the next process becomes longer.

On the other hand, as disclosed in JP-A-4-130618 and JP-A-7-122622, there have been proposed a manufacturing system and a manufacturing method which utilizes one-piece conveying devices for conveying wafers one by one among a plurality of processing units in series so as to shorten the complete process consisting of steps in series in order to aim at enhancing the yield.

In the conventional system, with the use of a plurality of processing units in series for processing, since no consideration has been made for avoiding crossing wafers to be conveyed one another, and the control and management of processing and conveying wafers one by one has been complicated, and accordingly, it has been very difficult in an actual mass-production firm in which wafers are successively processed. Further, since the total system consisting of a plurality of modules including various film forming units, a resist coating unit, various etching units and various inspection units is connected to a single ring-like piece conveying device such as, for example, a conveyer, through the intermediary of interface sections, the system becomes large-sized while a heavy load is exerted to the piece conveying device during mass production, resulting in considerable lowering of through-put. Further, for each of the processing units, a pair of transferring mechanisms for loading and unloading the wafers, a wafer identification device and a buffer are arranged in an interface unit between each of the various processing devices and the ring-like piece conveying device, and accordingly, the system becomes further complicate and large-sized.

Further, in another example, there has been proposed a loop-like piece conveying device utilizing a belt which turns around in two to four minutes while repeats a movement and a stop in a period of about 3 seconds. It is described that the delivery of a wafer between a processing unit and the loop-like conveying device is completed in one second within the above-mentioned period of about three minutes. However, it is difficult to surely deliver a wafer at such a high speed as mentioned above. Further, although for each of the processing unit, a wafer transferring robot should be provided in an inlet part thereof in order to deliver the wafer between the processing units and the conveying device, it is not incorporated at present in a standard system. Thus, it is necessary to install a system which is designed with a special specification so as to be expensive and require a long delivery time. Further, the loop conveying device requires a large floor area so as to be contrary to the intension of cost reduction in the investment of plant and place including building. Further, since only a serial process is implemented, should one of units on a line fail, the entire line would come to a stop.

SUMMARY OF THE INVENTION

The present invention is made to solve the above-mentioned problems, and accordingly, an object of the present invention is to provide a manufacturing system and a manufacturing method which can shorten the time required for completing a series of process carried out for an object to be processed, and which is flexible and inexpensive so as to be able to produce any of even various kind of articles in a short time, suitable for a system for and a method of manufacturing a semiconductor so as to mainly carry out a piece process and a piece conveyance.

The above object can be achieved according to the present invention, in the following processes. With respect to a concept of a processing apparatus for transferring an object to be processed between a mini-environment type object (wafer or the like) storage container such as the one corresponding to a FOUP (Front Opening Unified Pod) or SMIF and the body of a processing unit which have been standardized for 300 mm diameter semiconductor processing units, by way of a robot located in an atmospheric pressure clean space (refer to SEMI-E106-0301 of SEMI Standards), there is provided such a configuration that a cleaned atmospheric conveying zone provided in a shield space, for each of a plurality of processing units within this concept is developed into a common atmospheric pressure conveying zone which is common among the processing units so as to constitute each of a plurality of process modules, and sample transferring places are laid among the plurality of process modules, and between the process modules and the conveying and transferring zone in order to process a sample by way of the plurality of modules.

According to the above-mentioned configuration for solving the problems, since the concept for piece process sequence is applied for each of the plurality of process modules (which will be hereinafter abbreviated as "subsystem"), the process waiting time required for each adjacent processing units and caused during a lot process can be greatly reduced, and the total time from the introduction of a sample to the completion for the sample can be greatly shortened. Further, since each of the processing units is built up with the processing units by a relatively small number, the load of the common atmospheric pressure conveying device part is greatly reduced, whereby it is possible to prevent the through-put of the process modules from being lowered even on a mass-production base.

If a series of units for a multi-layer wiring process which carries out repetition of treatment or the like, is composed of these subsystems with the above-mentioned concept, the above-mentioned technical effects and advantages can become higher.

Since the conveyance between the above-mentioned subsystems or between the subsystem and a conventional device can be used in combination with conventional lot conveyance (AGV, RGV, OHS, OHT or the like) with the use of a mini-environment type object storage container such a FOUP, the degree of freedom of the system can be greatly enhanced in comparison with the conventional configuration in which the conveyance is limited only to the piece conveyance.

Specifically, the present invention provides a system and a method as explained below:

According to the present invention, there is provided a wafer manufacturing system incorporating a plurality of processing units each having therein a conveyance mechanism and laid in a line, and an inter-unit conveyer devices for conveying an object to be processed between the processing devices, the inter-unit conveyer device having a loader conveying means laid along object transferring ports of the plurality of processing units which are arranged in a line, and extending across more than two of the object transferring ports, the loader conveying means being arranged herein with a running robot which runs among more than two of the object transferring ports and a transferring robot for transferring the object to be processed on the running robot onto one of the processing units, and further, the inter-unit conveyer device being shielded and provided with a purifying device so as to define an atmospheric pressure space conveying path, and being arranged in the atmosphere.

According to the present invention, there is provided a a wafer manufacturing method comprising the steps of processing objects to be processed by means of a plurality of processing units each having at least one processing chamber and a conveying mechanism, temporarily storing the objects to be processed in order to introduce or deliver the object to be processed, conveying an object to be processed to a position around a desired one of the plurality of processing units through an atmospheric pressure clean space path in a loader conveying means, transferring the object to be processed between the desired processing unit and each of the loader conveying means with a timing which is different among the processing units, transferring the object to and from the loader conveying means through the atmospheric pressure space path therein, and conveying the same.

Other objects, features and advantages of the invention will become apparent from the following description of the embodiments of the invention taken in conjunction with the accompanying drawings.

DETAILED DESCRIPTION OF THE PREFERRED EMBODIMENTS

Embodiments of the present invention will be described with reference to the accompanying drawings.

Figure 1:
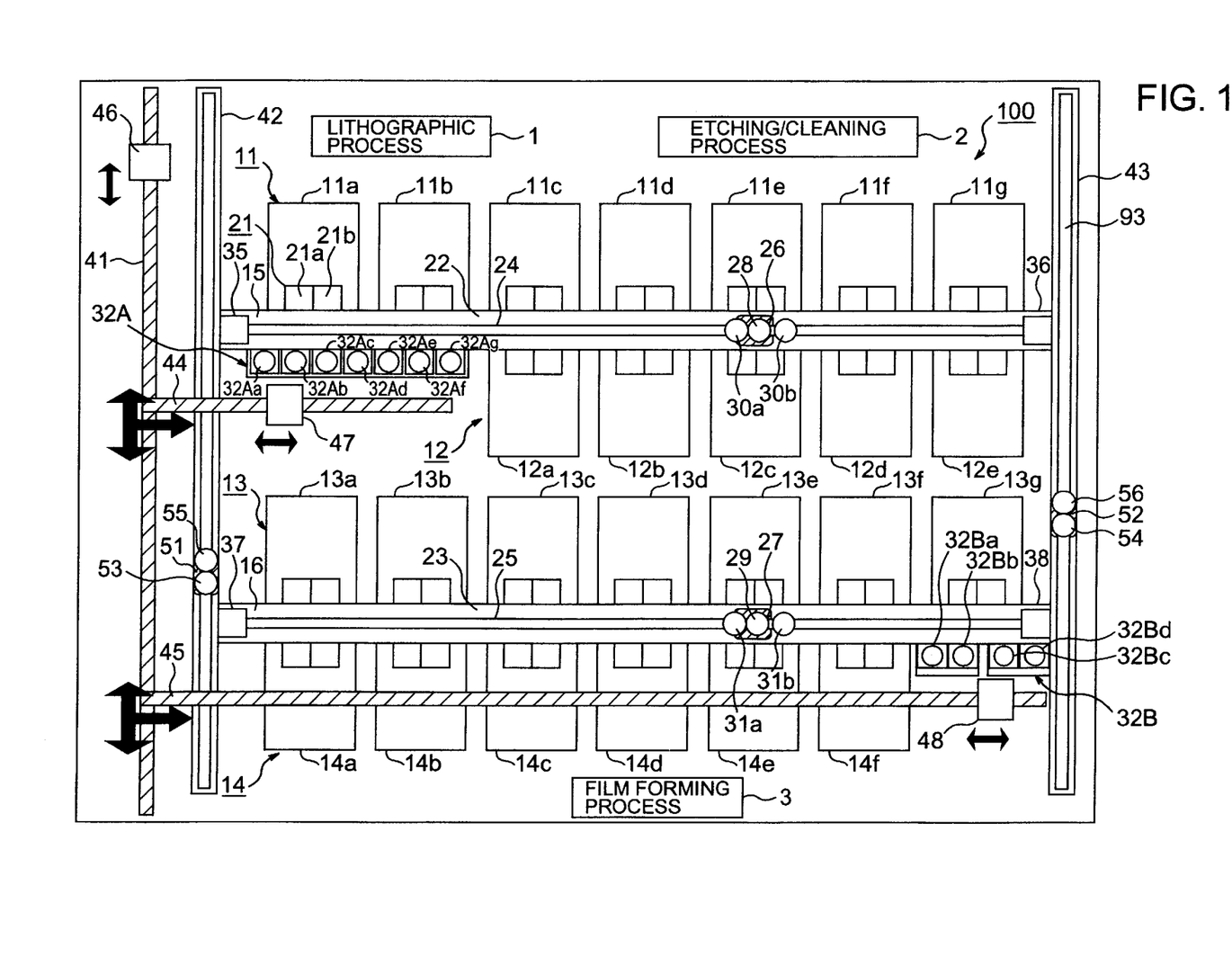
FIG. 1 is a view illustrating a configuration of an embodiment of the present invention.
Figure 2:
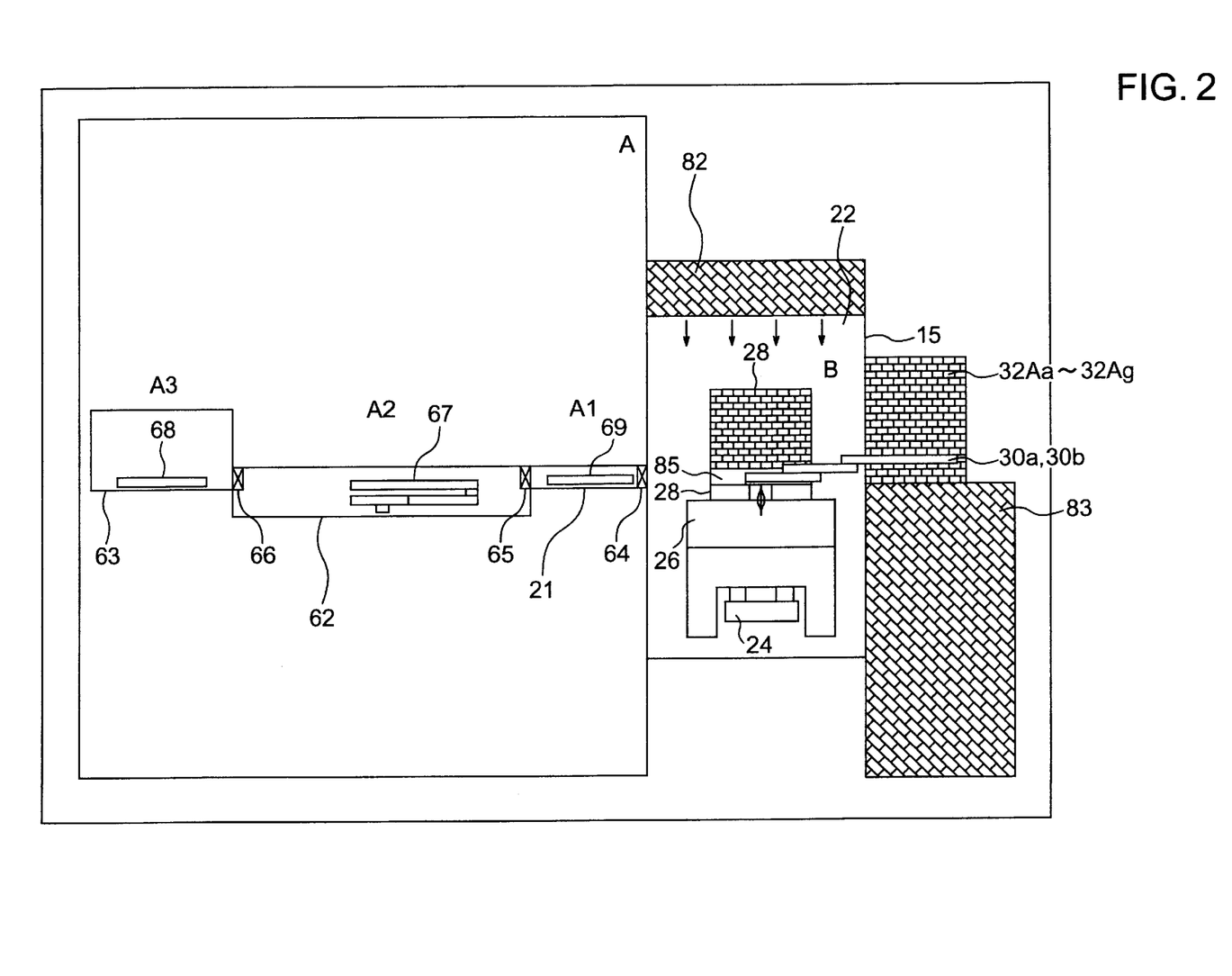
FIG. 2 is a sectional view illustrating the configuration shown in FIG. 1.
Figure 3:
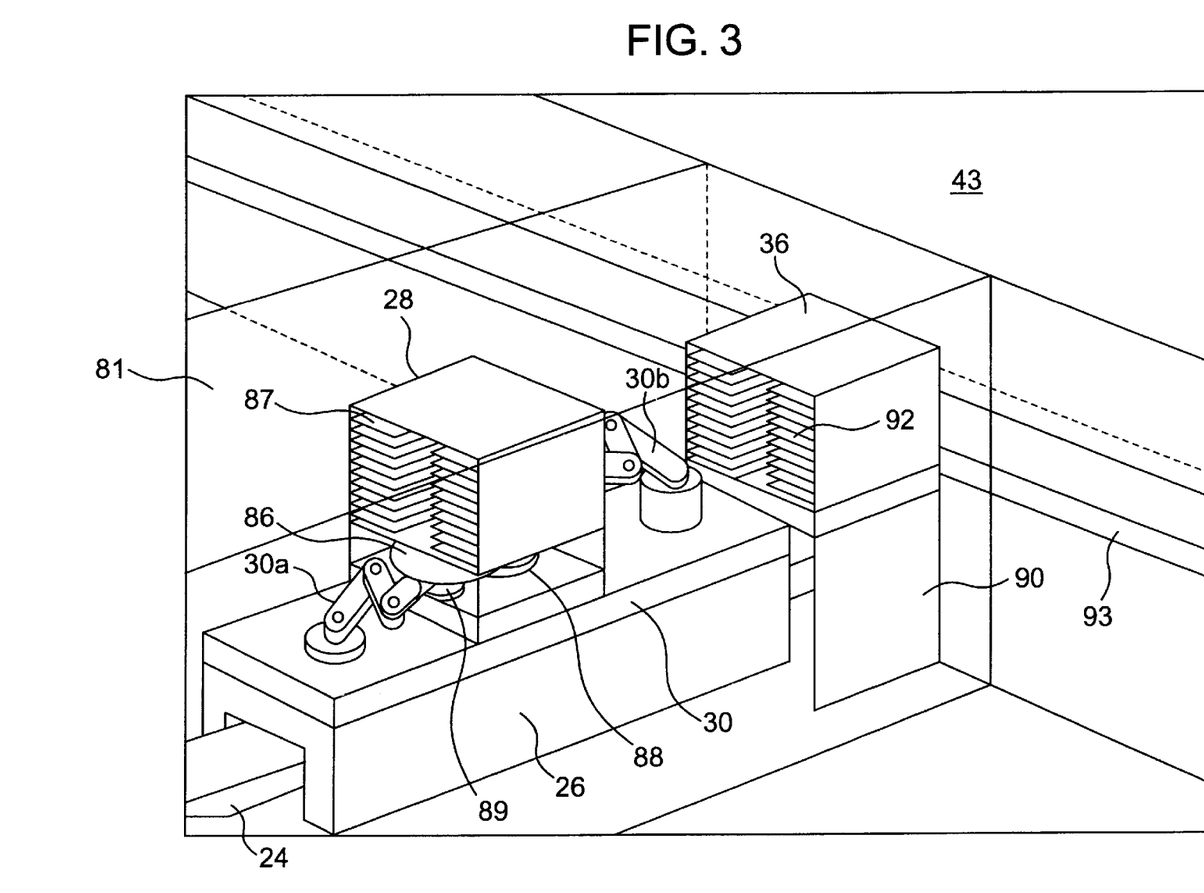
FIG. 3 is a detailed view illustrating a part shown in FIG. 1.
Figure 4:
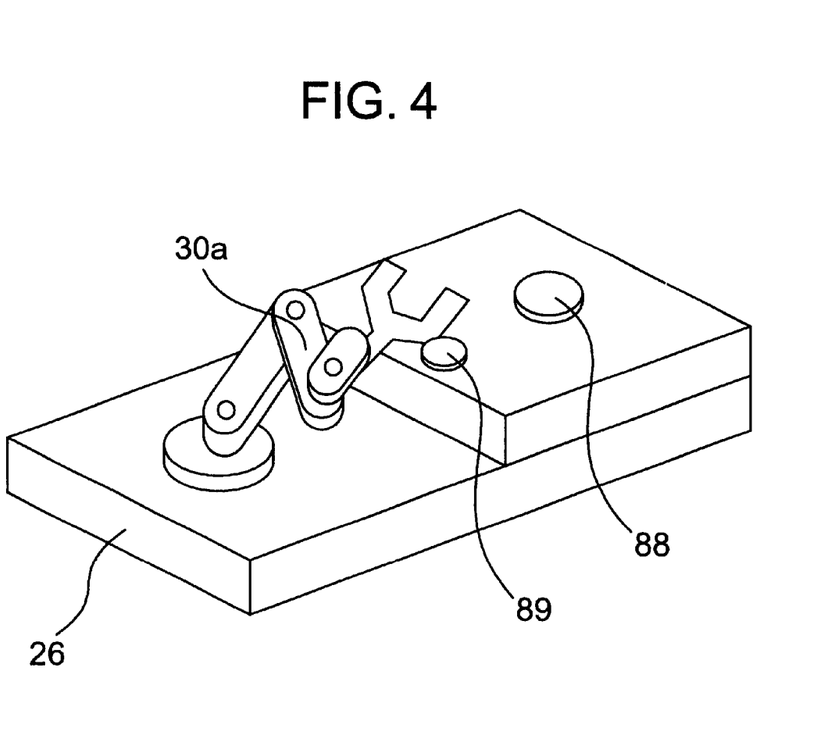
FIG. 4 is a detailed view of a part shown in FIG. 3.

FIGS. 1 to 4 show a first embodiment, and FIG. 1 shows a configuration of the first embodiment, FIGS. 2 and 3 show parts shown in FIG. 1, in detail, respectively, and FIG. 4 shows a part shown in FIG. 3.

Referring to FIG. 1, a wafer manufacturing system 100 which copes with a process module for processing a semiconductor substrate, a liquid crystal substrate or a component part substrate (wafer) includes various kinds of vacuum-processing units with which constitute, for example, a lithographic process 1, an etching/cleaning process 2 and a film forming process 3. These processes can be optionally changed in dependence upon a king of component parts to be manufactured.

As shown in this figure, the plurality of processing units 11, 12, 13, 14 are arranged in a line, and respectively consist of 11a, 11b, 11c, 11d, 11e, 11g; 12a, 12b, 12c, 12d, 12e; 13a, 13b, 13c 13d, 13e, 13f; and 14a, 14a, 14b, 14c, 14d, 14e.

The processing units 11a to 11g, 12a to 12e, 13a to 13f, and 14a to 14e are arranged in a line, respectively, each having therein a conveyance mechanism. A loader conveying means 22, 23 for conveying objects to be processed to the processing units are arranged along the processing units 11, 12, 13, 14. The processing units 11, 12 and the processing units 13, 14 are arranged being opposed to each other, respectively, and the loader conveying means 22, 23 are arranged between processing unit 11 and the processing unit 12, and between the processing unit 13 and the processing unit 14, respectively. The loader conveying means 22 corresponds to a first conveying means, and the loader conveying means 23 corresponds to a second conveying means.

Each of the processing units has a load lock chamber (including an unload lock chamber) 21 (21a, 21b) facing the loader conveying means 22, 23, and the load lock chambers of the processing units 11, 12, 13, 14 are arranged on a straight line. Gate valves are arranged on the inlet side and the outlet side of each of the load lock chamber, the gate valve arranged on the inlet side serves as an object transferring port. It is noted that in a system which carries out a process under the atmospheric pressure, such as CMP (Chemical Mechanical Polishing), the load lock chamber 21 can be changed into a wafer transferring zone in the ordinary pressure atmosphere.

An inter-unit conveyer device has the loader conveying means 22, 23 which are extended across more than two processing units, and conveying and transferring means 42 for transferring an object to be processed to and from the plurality of loader conveying means and conveying the same, defining an atmospheric pressure space conveying path, and is shielded so as to be additionally provided with a purifying device (means) while it is arranged in the atmosphere. With this arrangement, the space required to be purified, can be less even though the entire system is composed of a plurality of processing units arranged in a line, thereby it is possible to reduce the costs required for purification. It is noted that the atmospheric pressure space conveying path shielded and additionally provided with the purifying means is normally set at a pressure slightly higher than the atmospheric pressure, and accordingly, it is taken into consideration that the risk of entry of dust from an atmospheric zone becomes as low as possible.

Rails 24, 25 are laid in the loader conveying means 22, 23, respectively, which may be substituted by other means. For example, instead thereof, conveyers may be used. Running robots 26, 27 are provided on the rails 24, 25, respectively, in order to run thereon. These running robot 26, 27 includes buffer cassettes 28, 29 carried thereon for holding objects to be processed loaded on the running robots 26, 27 and adapted to be transferred onto the processing units 13, 14, and transferring robots 30, 31 are provided to the processing units 13, 14. Further, each of the processing units 11, 12, 13, 14 may include therein an inspection device for inspecting foreign object or the like, and a measuring device for measuring a processing function. The transferring robots 30, 31 have arms which extend through the transferring ports, respectively, and which are horizontally rotatable. Accordingly, the conveyer device (means) can be constituted. The arms carried by the transferring robots 30, 31 on their opposite sides will be denoted as first arms 30a, 31a, and second arms 30b, 31b, respectively.

The loader conveying means 22, 23 hold objects to be processed, and is adapted to transfer the objects to be processed to and from FOUP devices consisting of FOUPs arranged in the atmosphere. In the case shown in the figure, the FOUP devices 32A, 32B consist of seven FOUPs 32Aa, 32Ab, 32Ac, 32Ad, 32Ae, 32Af, 32Ag, and four FOUPs 32Bz, 32Bb, 32Bc, 32Bd.

Each of the FOUPs defines therein an atmospheric pressure space which is shielded. The atmospheric pressure space is opened by a gate opening means provided in each of the FOUPs when an object to be processed is transferred. As to the gate opening means, a well-know means may be used. The objects to be processed are delivered one by one from the atmospheric pressure spaces in the FOUPs into the first conveying path and the second conveying path through the transferring port constituted by the gate by means of the transferring robots 30, 31. It is noted that the FOUP device may be provided at least one position in a single process module although FIG. 1 shows such a configuration that the process module and the FOUP conveyer device 41 are connected with each other through the intermediary of the FOUP devices 32A, 32B located at two positions. In the configuration shown in FIG. 1, the second FOUP device 32A is provided in order to aim at improving the through-put in the case of using only a part of the process module, such as a lithographic process step or the lithography process step and an etching/cleaning step.

The loader conveying means 22, 21 are laid, being straight line-like, and include buffer cassettes 35, 36, 37, 38 arranged on opposite sides thereof. Objects to be processed, which are conveyed on the atmospheric pressure space conveying path are held in an atmospheric pressure condition by means of the buffer cassettes 35, 36; 37, 38.

Conveying and transferring means 42, 43 as other conveyer devices are laid in a direction crossing the loader conveying means 22, 23 which are laid in a plurality of parallel systems. The conveying and transferring means 42 serves as a third conveying path and the conveying and transferring means 43 serves as a fourth conveying path.

The FOUP conveyer devices 41, 44, 45 are provided therein with FOUP transferring devices 46, 47, 48 and the like, the FOUPs are continuously conveyed as indicated by the arrows by way of branching points, and accordingly, the FOUPs can be transferred to and from FOUP pedestals 32Aa to 32Ag, 32Ba to 32Bf.

Running robots 51, 52 are provided on the third and fourth conveying paths, respectively, and are mounted thereon with buffer cassettes 55, 56, respectively.

Inter-path buffer cassettes 35, 36, 37, 38 serve as object holding storages between the conveying paths so as to manage the transferring of the objects to be processed which are conveyed on the first, second, third and fourth conveying path onto other conveying paths, FIG. 2 is an enlarged sectional view which shows the system shown in FIG. 1, in order to explain a method of conveying objects to be processed into a vacuum processing unit as a processing unit.

The manufacturing system includes a vacuum processing device zone A and a loader conveying means zone B.

In the vacuum processing unit zone A, there are horizontally arranged a load lock chamber (A1) 21, a vacuum conveying chamber (A2) 62 and a processing chamber (A3) 63. As shown in the figure, gate valves 64, 65, 66 are provided in an inlet part of the load lock chamber 21, and an inlet part and an outlet part of the vacuum conveying chamber 62, respectively. A conveying robot 67 incorporating arm is provided in the vacuum conveying chamber 62 while a processing bed is provided in each of the processing chambers (which have a plural number in many cases), and an object loading bed 69 is provided in the load lock chamber 21.

It is noted that the load lock chamber may be changed into a wafer transferring means in a device which carries out a process under the atmospheric pressure, as mentioned above, and accordingly, it goes without saying that all or a part of the gate valves 64, 65, 66 may be eliminated.

The two zones are incorporated in one integral unit through the intermediary of the gate valve 64. A filter 82 for feeding purified air is added to the conveying path in the loader conveying means 22 in order to introduce purified air.

The running robot 26 is set on the rail 24, and the transferring robot 30 is provided on the running robot 26 so as to be vertically movable. The transferring robot 30 has a first arm 30a and a second arm 30b which are adapted to extend through the transferring ports of the FOUPs 32Aa to 32Ag so as to receive or deliver objects to be processed through the transferring ports of the FOUPs 32Aa to 32Ag. Further, an ID sensor 89 and a sample center/direction adjusting unit 88 are mounted on the buffer cassette 28 on the running robot and in a sample center/direction adjusting space 85. As mentioned above, the loader conveying means 22 includes the FOUPs 32Aa to 32Ag, and the atmospheric pressure space in the loader conveying means 22 is communicated with the atmospheric pressure spaces of the FOUPs 32Aa to 32Ag when a gate incorporated in the loader conveying means is opened so that the outer surfaces thereof are exposed to the atmospheric air, and accordingly, the spaces in the loader conveying means 22, 23 are decreased.

The FOUPs 32Aa to 32Ag are set on a FOUP cradle 83. FIG. 3 is a view for explaining such a situation that an object to be processed is transferred between the inter-path buffer cassette 36 and the conveying path.

As mentioned above, the running robot 26 runs on the rail 24, and the transferring robot 30 is mounted on the running robot 26. Further, the transferring robot 26 has the first arm 30a and the second arm 30b. The buffer cassette 28 is carried on the running robot 26. The buffer cassette 28 has a plurality of racks for holing a plurality of objects 86 to be processed.

The ID sensor 28 and the sample center/direction adjusting unit 88 are provided in the lower part of the buffer cassette 28.

The buffer cassette 28 on the running robot is opposed to the inter-path buffer cassette 36 at the terminal end part of the load conveying means 22.

The inter-path buffer cassette 36 is mounted on the cradle 90 and supports a plurality of racks 92, and holds therein a plurality of racks 92, and the objects to be processed is transferred between the buffer cassette 28 on the running robot 26 and the inter-path buffer cassette 36.

The objects to be processed are transferred into the buffer cassette 54 mounted on the conveying robot 52 which runs on a rail 93 laid in the fourth conveying path, from the inter-path buffer cassette 36 by means of the arm 56.

FIG. 4 is a view for explaining such a situation that the arm 30a, the ID sensor 89 and the sample center/direction adjusting unit 88 are arranged. With these equipments, a number of an object to be processed is identified by the ID sensor 89, and the sample center and the direction are adjusted by the sample center/direction adjusting unit 88. The arm 30b can carry out motion similar to that of the arm 32a.

As mentioned above, the loader conveying means 22, 23 include the running robots 26, 27 which are mounted thereon with the transferring robots 30, 31 for transferring objects to be processed to and from the processing units 11 to 14, and the robot running space is provided with the purifying means and is shielded from the other parts so as to define a shield space.

Thus, there can be provided a manufacturing system in which a plurality of processing units are connected by means of the inter-path buffer cassette which can be accessed from its opposite sides.

The buffer cassette 28 on the running robot serving as an object storage means which can accommodate therein a plurality of object to be processed, for introducing and delivering an object to be processed into and from a processing unit is provided in the shield space.

The load lock chamber 21 which serves as a transferring space to and from at least one vacuum processing unit exhibits a vacuum condition and an atmospheric pressure condition, and the transferring of the object to be processed to and from the conveyer device is carried out when the load lock chamber 21 exhibits the atmospheric pressure condition. The load lock chamber 21 defines therein one or two chambers. In the case of the two chambers, there may be used one of them as a load lock chamber, and the other one of them as an unload lock chamber, or there also may be used both of them independent from each other as bidirectional load lock chambers. Further, as mentioned above, in a system in which a process is carried out under the atmospheric pressure, such as CMP, the load lock chamber 21 can be changed into a transferring zone for objects to be processed in an atmospheric pressure condition.

The objects to be processed are transferred basically one by one between the load conveying means or the conveyer device in the conveying and transferring means and the processing units.

Further, a measuring device for measuring characteristics (for example, foreign object, a film thickness a processed shape or the like) of an object to be processed before and after processing, may be arranged adjacent to the load conveying means or the conveying and transferring zone so as to enable the object to be processed to be transferred thereto.

By installing and running the sample transferring robot having an arm mechanism and a lifting mechanism in the cleaned common atmospheric pressure conveying zone, a sample can be transferred to and from the processing unit side with the provision of a sample cradle alone or a sample cradle with a mechanism such as a lifting mechanism or a pin lifting mechanism. In particular, in a 300 mm diameter semiconductor processing unit, the transferring of a sample to the processing unit body from the atmospheric pressure conveying means exhibits high merits. No conventional several arms and a transferring mechanism provided for each of the processing units are required between the conveyer device and the processing units, and accordingly, the configuration of the system can be simplified, thereby it is possible to expect enhancing the reliability and greatly lowering the system cost.

It is noted that with the addition of the ID sensor 89 or a sample ID reader, the sample center/direction adjusting unit 88 and the like in the zone where the sample transferring robot is installed, there are exhibited such advantages that the confirmation and the correction can be made so as to facilitate the management of samples, and the initialization of samples, and further, that the number of ID sensors 89 or ID readers and the number of the sample center/direction adjusting units, each having conventionally been provided for each of the processing unit, can be greatly reduced.

It is noted that the conveying and transferring means 43 and the inter-path buffer cassettes 36, 38 may be eliminated in order to simplify the system configuration while the loader conveying means 22, 23 are crossed over the conveying and transferring means 42 at their one end although the time required for the conveyance becomes longer. Further, one of the FOUP devices 32A, 32B may be eliminated or the number thereof reduced, or they may be laid adjacent to the conveying and transferring means 42.

Figure 6:
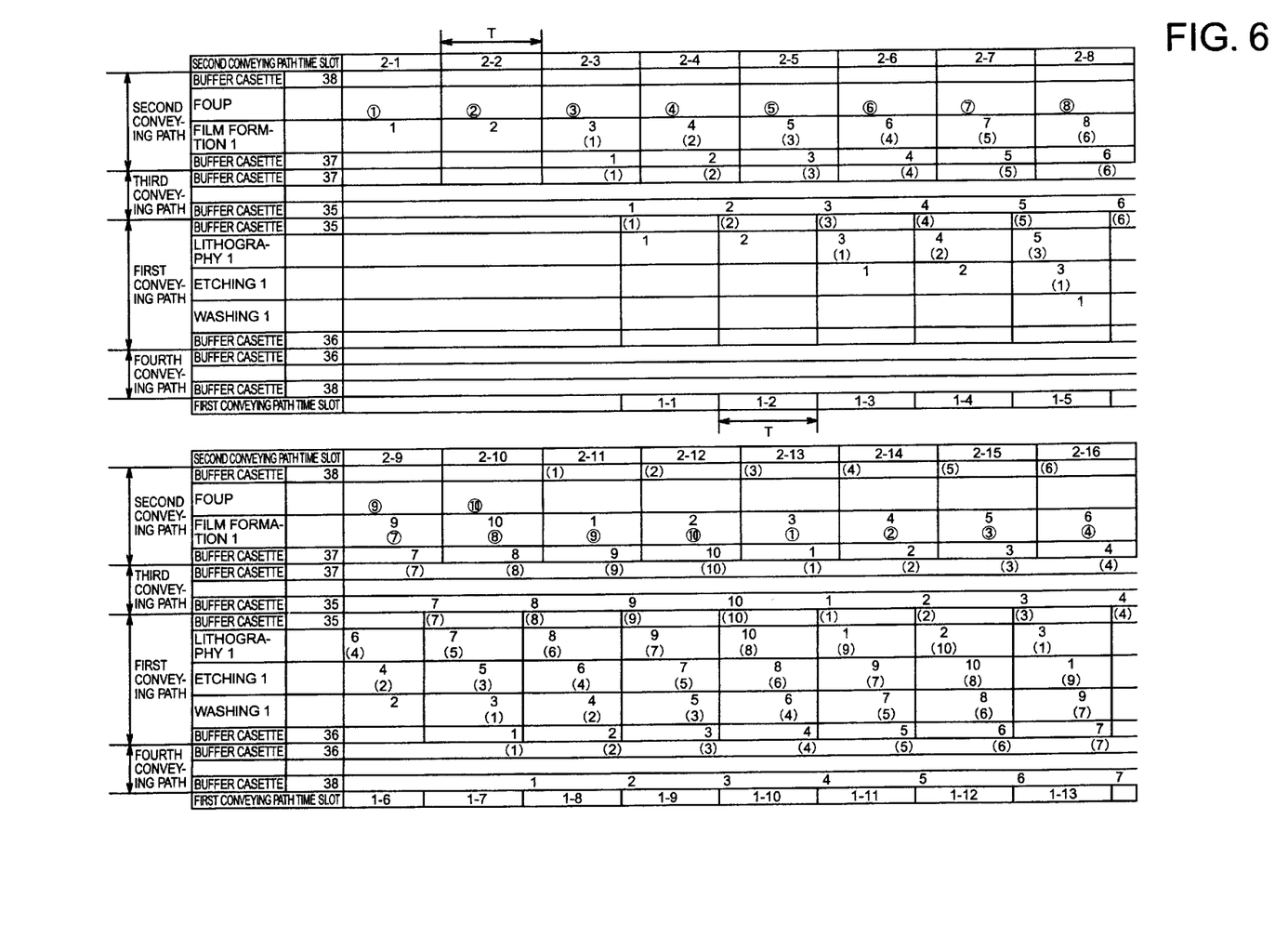
FIG. 6 is an operation timing chart in FIG. 1.
Figure 7:
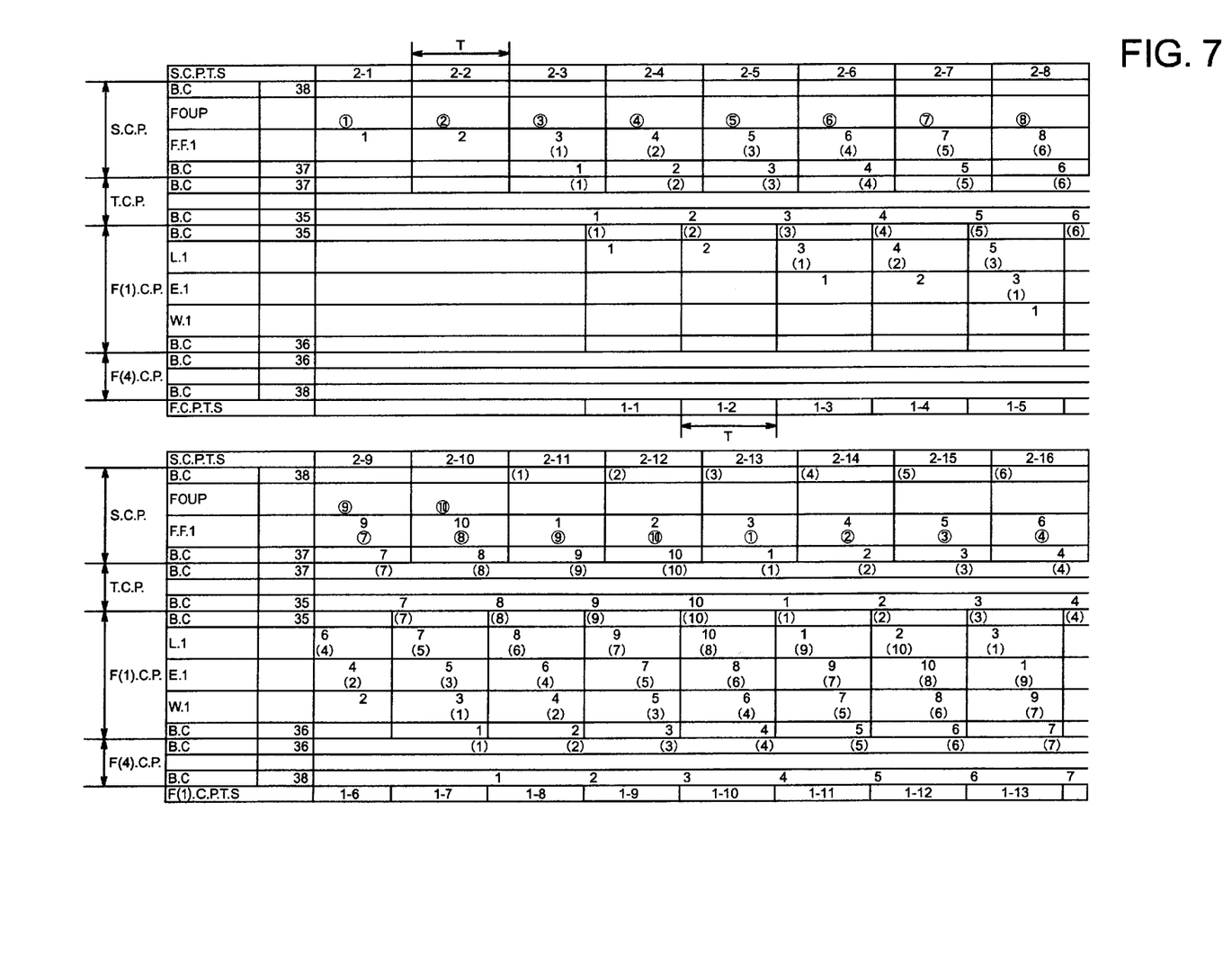
FIG. 7 is another operation timing chart according to the present invention.
Figure 8:
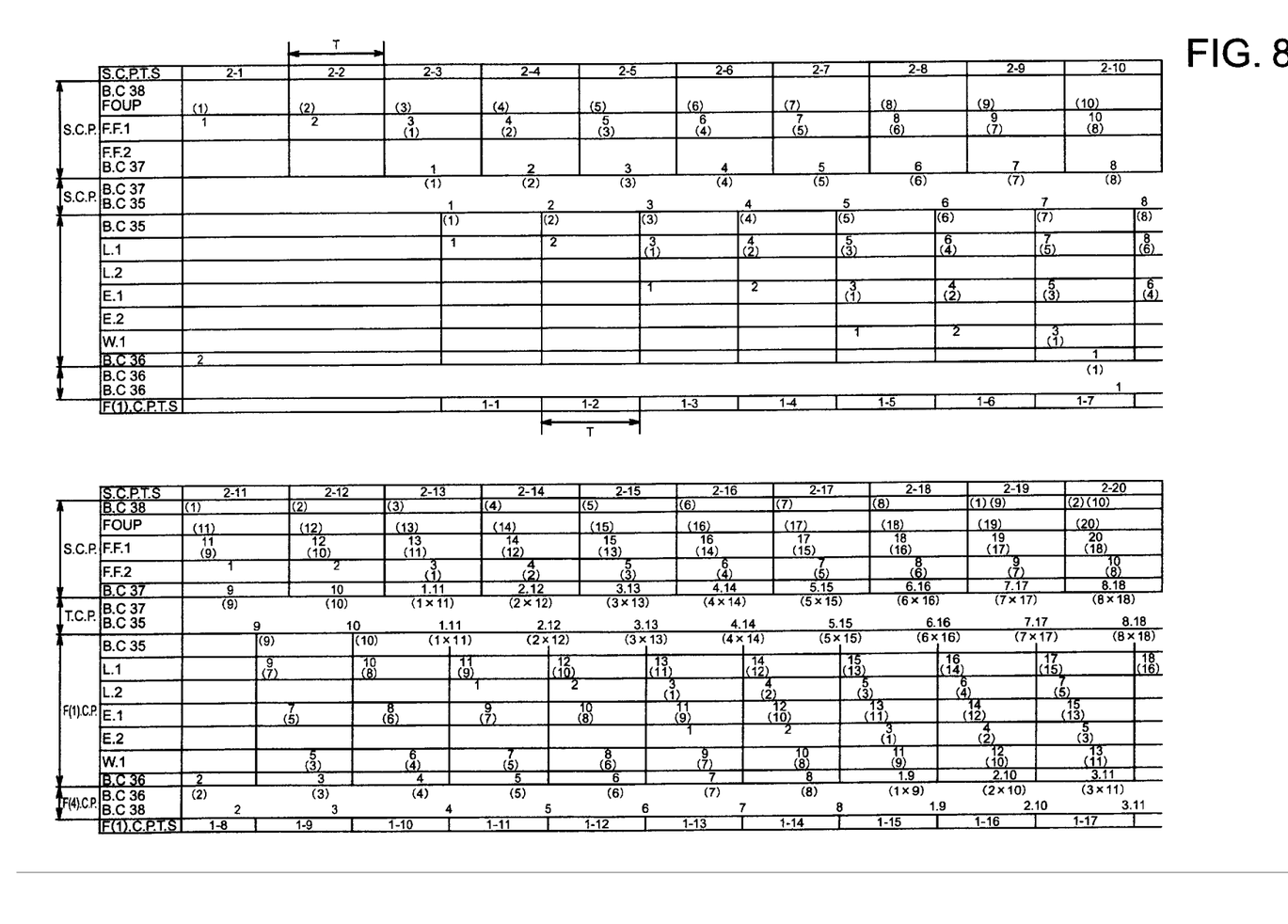
FIG. 8 is a further operation timing chart according to the present invention.

FIGS. 6, 7 and 8 are timing charts which show the stream of wafers when a FOUP accommodating therein wafers is introduced into the FOUP device 32B on the second conveying path, with the time being taken along the abscissa (No FOUP device 32A is used in this case).

FIGS. 6 and 7 show such a configuration that one film forming device in which a heating chamber, a plurality of film forming chambers and conveyer mechanism therebetween are synthesized, is installed on the second conveying path, and one lithography device, one etching device and one cleaning device are installed on the first conveying path. FIG. 6 shows a configuration in the case of such a process that wiring is made in one layer, and FIG. 7 shows a configuration in such a case that wiring is made in multiple layers. There is shown such a case that each of the units also includes a plurality of processing chambers, and a pre-processing chamber and a post-processing chamber for this process, and receiving a wafer onto each unit and extracting a wafer from each unit can be made within 6 minutes while receiving and extracting a wafer at each unit can be made in a three minute cycle period (T in the figures shows 3 minutes).

Numerals in the figures are numbers of wafers, and numerals surrounded by a circle exhibit delivery of wafers from the units (including the inter-path buffer cassette and the FOUP) onto the conveyer device, and the numerals with no circle show timings of receiving wafers from the conveyer device onto the units.

When six layers are processed with the timings shown in FIG. 7, the time Ts from the start of processing for a first wafer to the completion of processing for an N-th wafer is given by the following formulae (Incidentally, FIG. 7 shows timings in the case of N=10, but in the case of N≧11, a wafer which has been returned to the inter-path buffer cassette 38 on the original second conveying path is temporarily accommodated in the FOUP 32B, and is then conveyed again after completion of a wafer on the previous stage).

N=1:Ts=3 min.×10 Time Slots×6 Layers =180 min

N=5:Ts=3 min.×10 Time Slots×6 Layers +3 min.×4=192 min

N=10:Ts=3 min.×10 Time Slots×6 Layer +3 min.×9=180 min.

N>11:Ts=3 min.×10 Time Slots×6 Layer +3 min.×9=180 min.

N=24:Ts=459 min.

Meanwhile, in the case of a conventional configuration in which wafers are conveyed between units in a FOUP as a unit, if 6 layers are processed, the time Tb required from a start of processing of a first wafer to a completion of processing of N-th wafer is exhibited by the following formula:

$$Tb=((6 \text{ min.}+(N-1)\times 3 \text{ min.})+t)\times 4 \text{ devices}\times 6 \text{ layers}$$

where t is a time (minutes) required for conveying a FOUP between the units, which is estimated as 2 minutes in the following case:

N=1:Tb=192 min.
N=5:Tb=480 min.
N=10:Tb=840 min.
N=24:Tb=1848 min.

In the case of processing a single wafer, that is, N=1, substantially no difference is appreciated between Ts in the configuration according to the present invention and Tb in the conventional configuration, which exhibit a total processing time, but in the case of N=5, Ts becomed less than a half of Tb while in the case of N≧10, and Ts becomes less than a quarter of Tb so that it is greatly shortened.

This improvement can be enhanced as the number of layers to be processed and the number of units used per layer are increased.

In comparison with a conventional piece conveying path system in which wafers are transferred one by one onto processing units by means of a single conveying path, in the system according to the present invention, in which a plurality of conveying paths are coupled with one another by means of the inter-path buffer cassettes, although the total processing time must be increased more or less by the time required for carrying our several conveyances, the time which can be used for transferring between the loader conveying means and the processing units can be increased, and accordingly, there can be offered such an advantage that the reliability can be enhanced while stable operation can be obtained. Further, no complete synchronization is required among a plurality of the loader conveying means, and accordingly, the freedom of operation of the loader conveying means can be increased, thereby it is possible greatly facilitate the scheduling of the operation.

FIG. 8 shows such a configuration that two film forming devices are installed on the second conveying path while two lithography devices, two etching devices and one washing device are installed on the first conveying path. In this case, a plurality of layers are successively processed, and the processing for each odd number of a layer is carried out by devices for film formation 1, lithography 1, etching 1 and cleaning 1 while the processing for each even number of a layer is carried out by devices for film formation 2, lithography 2 and etching 2. It is noted that a washing function for each odd number layer is incorporated in the device for etching 2. Similar to FIGS. 6 and 7, FIG. 8 shows such a case that receiving a wafer onto each unit and delivering a wafer from each unit can be made within 6 minutes while receiving and delivering a wafer at each unit can be made in a three minute cycle period (T in the figures shows 3 minutes).

In zones of the inter-path buffer cassettes 35, 36, 37, 38, parts where numerals are juxtaposed thereto, are those in which a plurality of wafers are accommodated in the buffer cassette. Although there is caused a waiting time between the processing of an odd number layer and the processing of an even number if N is greater than 11 in the case of FIG. 7, if different devices are used respectively for an odd number wafer and an even number wafer, as shown in FIG. 8, no waiting time as mentioned above is caused, thereby it is possible to greatly shorten the total processing time in the case of a large number of wafers.

By uccessively increasing the number of devices installed in the loader conveying means in accordance with a number of wafers introduced as mentioned above, the total processing time can be flexibly shortened.

Further, if the number of process module lines each composed of a plurality of loader conveying means is increased, it can cope with a larger number of wafers.

The manufacturing method in this embodiment comprises the steps of processing an object to be processed with at least two processing units each having at least one processing chamber and a conveying mechanism, transferring the object to be processed between different processing units through the intermediary of a loader conveying means, temporarily holding objects to be processed in a storage means in order to introduce and deliver the objects to and from a manufacturing system, transferring the object to be processed to and from the loader conveying means in object transferring spaces in a desired processing unit and the storage means, conveying the object to be processed to a desired position by means of the loader conveying means, and transferring the objects to and from the loader conveying means, and conveying the same, wherein the object to be processed is transferred between a desired processing unit and the loader conveying means with a timing which is different among the processing units.

Further, the other manufacturing method comprises the steps of processing an object to be processed with at least two processing units each having at least one processing chamber and a conveying mechanism, temporarily holding objects to be processed in a storage device in order to introduce and deliver the objects to be processed into and from a manufacturing system, measuring a processed condition of an object to be processed with at least one measuring device, transferring the objects to be processed between the processing unit and the measuring devices through the intermediary of a loader conveying means, transferring the object to be processed to and from the loader conveying means in object transferring spaces in a desired processing unit, the storage device and the measuring device, conveying the object to be processed to a desired position by means of the loader conveying means, and conveying the same to a desired position by means of the loader conveying means, wherein the object to be processed is transferred among a desired processing unit, the storage means and the measuring means and the loader conveying means with a timing which is different among the processing units, the storage means and the measuring means.

In these manufacturing methods, there may be provided the step of temporarily storing the object to be processed in the loader conveying means between the steps of receiving the object to be processed onto the loader conveying means and delivering the object to be processed by means of the loader conveying means.

In the case of a simple system in which the loader conveying means, the FOUP for transferring, the processing unit and the measuring deice are arranged along a process sequence as shown in FIG. 6 or 7, the transferring of an object to be processed as viewed from the running robot 26, 27 side, is carried out with the repetition of (A receiving), (A delivering), (B receiving) and (B delivering) in the mentioned order, and it is only sufficient to hold an object to be process in one of the transferring robots 30, 31 on the running robots. Accordingly, the buffer cassettes 28, 29 and the like on the running robots are not always necessary. However, in the case of an actual process module, it is very rare that all devices are arranged along a process sequence. In this case, it should be better to carry out not less than two cycles of receiving, successively, such as (A receiving), (B receiving), (A delivering), (C receiving) and (C delivering) and (B delivering) in the mentioned order in transferring as viewed from the running robot side, in order to greatly simplify the running sequence of the running robots which shortening the time required for conveyance, thereby it is possible to enhance the through-put of the process module. In order to cope with this case, according to the present invention, the buffer cassettes 28, 29 are mounted on the running robots 26, 27, or a plurality of transferring robots are provided on the one of the running robots 26, 27, and accordingly, not less than two of objects to be processed can be simultaneously set on the running robot. Incidentally, a time slot shown in FIG. 8: in the case of 1–17 in which metal multi layer wiring is carried out in one and the same process module, the transferring of the object to be processed as viewed from the running robot side, consists of (7-receiving), (17-receiving), (17-delivering), (15-receiving), (7-delivering), (5-receiving), (15-delivering), (13-receiving), (5-delivering), (3-receiving), (13-delivering), (11-receiving), (3-delivering) and (11-delivering) in the mentioned order. In this case, although the timing with which two objects to be processed are simultaneously mounted on the running robot is caused at several positions, the running of the running robots can be greatly simplified by installing the buffer cassettes 28, 29 on the running robots 26, 25 in order to add such a function that the objects to be processed are temporarily stored.

If a number of used devises are increased in the loader conveying means in these manufacturing methods, the step of receiving an object to be processed onto the transferring robot in the running robot, is carried out for all necessary processing units, the storage device and the measuring device in the loader conveying means so as to accommodate them in the buffer cassettes 28, 29 on the running robots, and then, successively, the step of delivering and feeding the objects to be processed from the buffer cassettes 28, 29 on the running robots, by means of the transferring robots in the running robots, is carried out for all necessary processing units, the storage device and the measuring device in the loader conveying means while the step of receiving the object to be processed by the transferring robots in the running robots is started at every predetermined cycle period. Thereby it is possible to greatly simplify the method of running the running robots, the process sequence and the manufacturing method, and to enhance the through-put of the process.

Figure 5:
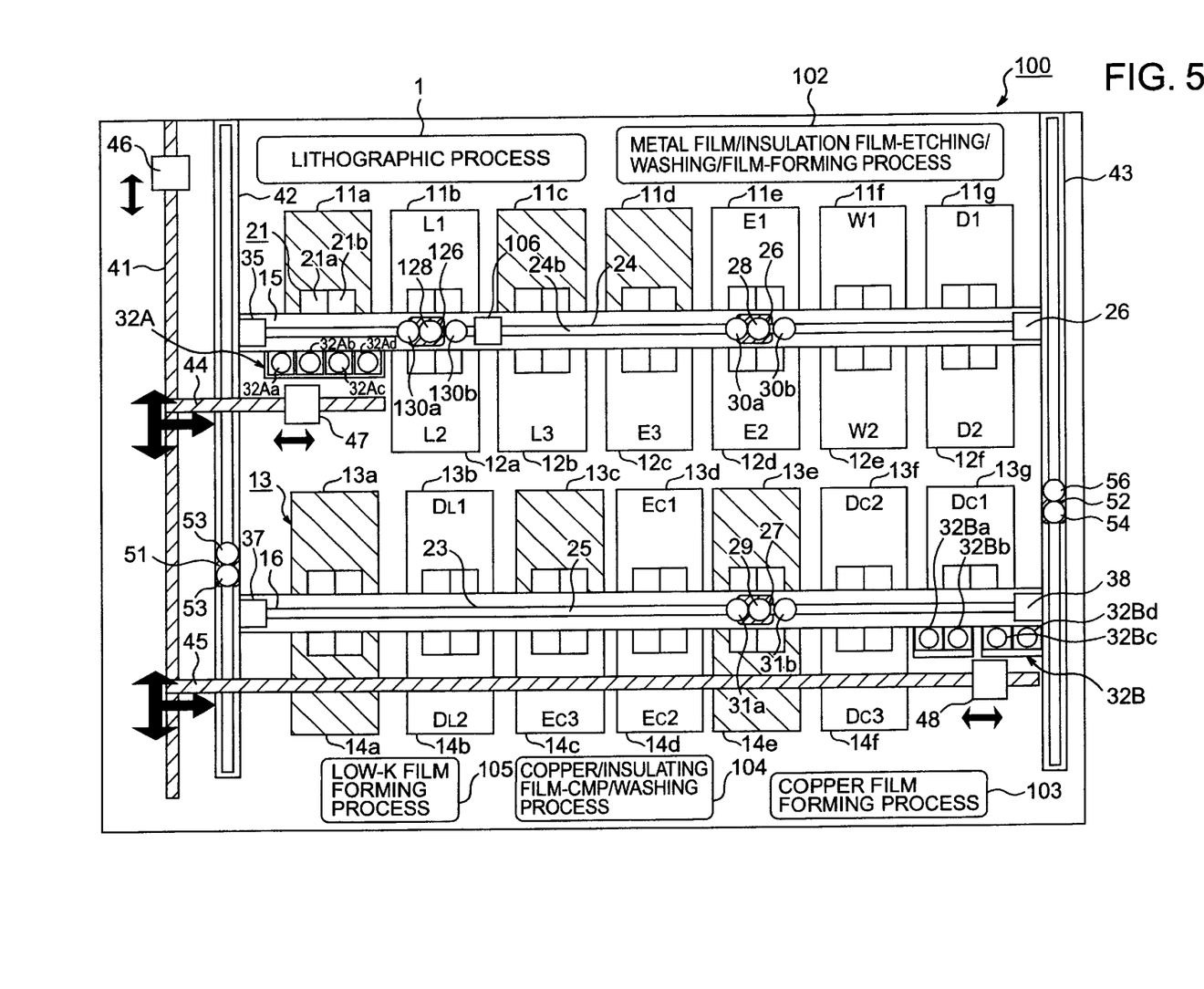
FIG. 5 is a view illustrating a configuration of another embodiment of the present invention.

FIG. 5 shows the configuration of another embodiment which is basically similar to the embodiment shown in FIG. 1, and accordingly, like reference numerals are used to denote like parts. Further, the explanation will be made of parts which are different from the embodiment shown in FIG. 1. Accordingly, those other than the parts should be referred to the explanation as to FIG. 1.

While the embodiment shown in FIG. 1 is consists of the lithography process (11*a*–11*c*, 12*a*), the etching/washing process (11*d*–11*g*, 12*b*–12*e*) and the film forming process (13*a*–13*f*), (14*a*–14*e*), the embodiment shown in FIG. 5 consists of a lithography process 1 (L1, L2, L3), a metal film/insulation film-etching/washing/film-forming process 102 (Etching E1, E2, washing W1, W2, and filming forming D1, D2), a copper film forming process 103 (Dc1, Dc2, Dc3), copper/insulation film-CMP/washing process 104 (copper/insulation film-CMP Ec1, Ec2, Ec3) and Low-k film forming process 105 ($D_L1$, $D_L2$). The lithography process composed of a pretreatment such as washing or the like, resist application, exposure, baking and the like greatly affects the through-put of the entire system in the process module. Accordingly, a sole robot 128 is provided for the lithography process in order to shorten the time required for the conveying path during the lithography process in the case show in FIG. 5.

For the processing units 11*a*, 11*c*, 11*d*, 12*c*, 13*a*, 13*c*, 13*e*, 13*g*, 14*a* and 14*e*, there are ensured in installation spaces for expansion.

Referring to the figure, there are shown L1(11*b*), L2(12*a*), E1(11*e*), E2(12*d*), W1(11*f*), W2(12*e*), D1(11*d*), D2(12*f*), Dc1(13*g*), Dc2(13*f*), Dc3(14*f*), $D_L1$(13*b*), $D_L2$(14*b*), Ec1 (13*d*), Ec2(14*d*) and Ec3(14*c*).

Referring to the figure, a rail 24 is composed of two rails 24*a*, 24*b*, and a running robot 126 is set on the rail 24*a*, and the transferring robot 128 is provided on the running robot 126 while the transferring robot 128 has an arm 130*a* and an arm 130*b*. The running robot 26 is set on the rail 24*b*, similar to that shown in FIG. 1.

A buffer cassette 106 is provided between the two rails, and the buffer cassette 106 has a configuration similar to the buffer cassette 84 shown in FIG. 3 so as to constitute an inter-path buffer cassette between the two rails.

Further, with the embodiment shown in FIG. 1 or FIG. 5, the atmospheric pressure peace conveying means which is cleaned, for each of the units provided in the shield space in this concept is broadened into a common atmospheric pressure peace conveying means having a configuration which is common among a plurality of processing units so as to build up a single process module, and sample transferring places are provided among a plurality of process modules or between the process modules and the piece conveying mechanism in order to process samples by way of the plurality of modules, thereby it is possible to greatly shorten the compete process consisting of steps in series applied for the object to be processed.

It is noted that although the explanation will be made of such a configuration that the buffer cassettes are provided between a plurality of loader conveying means arranged in each process module, the present invention should not be limited to this configuration but it can, of course, also applied to a case in which the process module consists of a single loader conveying means. For example, the present invention can also applied to such a configuration that the units connected to the loader conveying means 23 are concentrated toward the loader conveying means 22, and the conveying and transferring means 42, 43, the loader conveying means 23, the buffer cassettes 35, 36, 37, 38 and the like are eliminated.

Further, explanation has been made of such a case that only one running robot 26, 27 is used in the loader conveying means with reference to FIGS. 1, 2, 3 and 5, the present invention should not be limited to this case, but a plurality of conveying lines or a loop-like conveying line may be provided in a single loader conveying means. Although this configuration causes a disadvantage since the manufacturing costs for the manufacturing line are increased, there may be presented such an advantage that a plurality of running robots can be provided in a single loader conveying means, and accordingly, it is possible to aim at either shortening the conveying time or enhancing the manufacturing throughput. Further, even though one of the running robots fails, the other one of the robots can be used in order to operate the process module, thereby it is possible to enhance the reliability of the manufacturing line.

Figure 9:
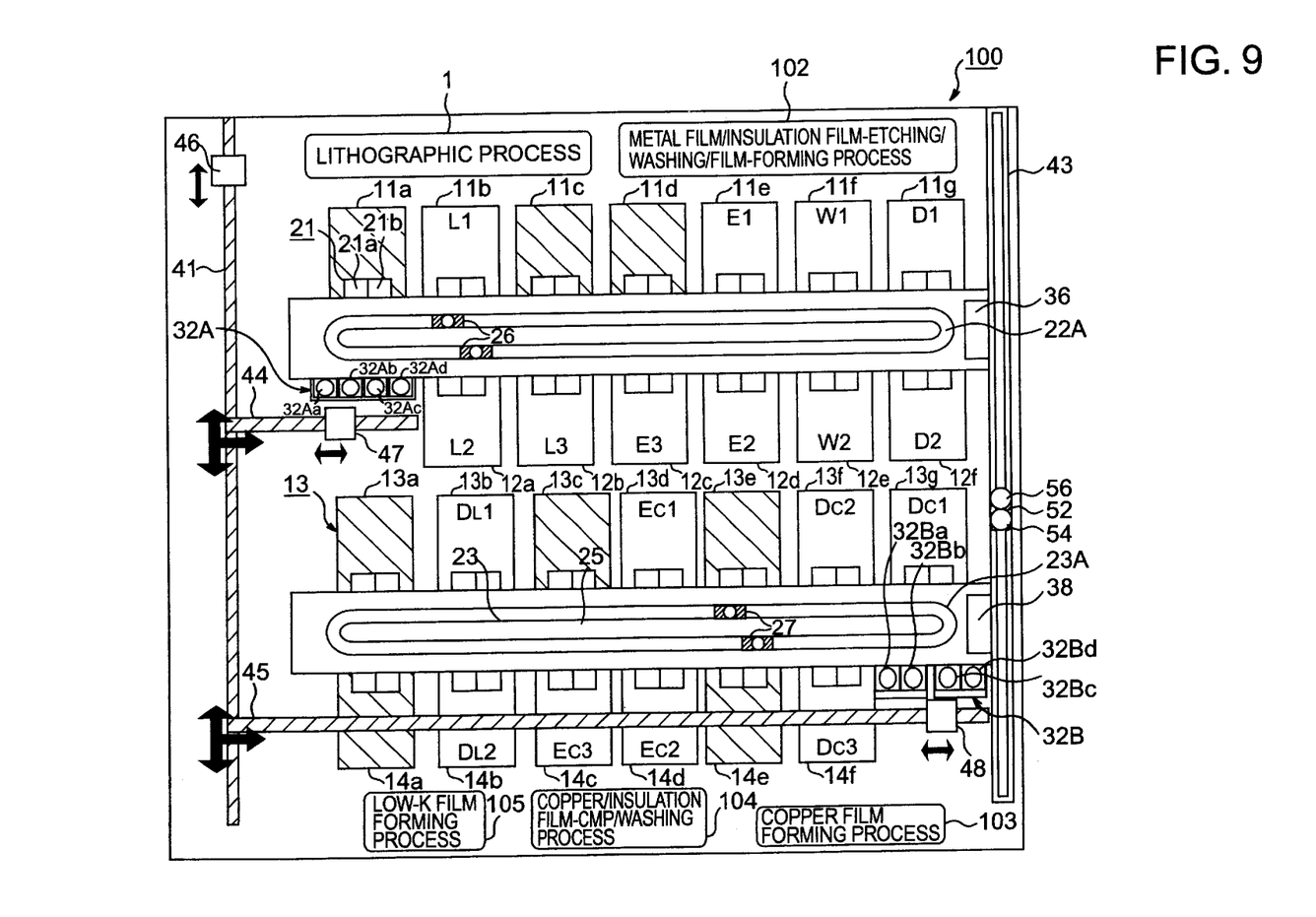
FIG. 9 is a view illustrating the configuration of another embodiment shown in FIG. 5.

FIG. 9 shows another example, which is a variant form of the embodiment shown in FIG. 5. Although the loader conveying means 22, 23 are configured linearly in the embodiment shown in FIG. 5, in this example, the running robots 26, 27 (which are the same as shown in FIG. 4) are provided in the loop-like loader conveying means 22A, 23A, respectively. However, in this example, due to the loop-like configuration, there may be provided a plurality of robots per loop, such as two robots in one of the loop-like loader conveying means in this example, as show in the figure. It is noted that the third conveying path 24 which is one of the conveying and transferring means in the direction crossing the loader conveying means 22, 23 is eliminated in the example shown in FIG. 9, and the fourth conveying path 43 is used, substituted therefor.

As to the loop-like conveyance system, there are a contact type rail system and a non-contact type rail system. Further, as to the non-contact type rail system, a linear type (using magnetism), a gas pressure type or a line detection type (using a conveyer belt) may be used. With the selection of the non-contact type rail system which can reduce slide parts thereof, it is possible to avoid friction. Accordingly, generation of particles such as abrasive powder caused by the friction can be restrained so as to ensure a clean environment. Further, it is possible to prevent the yield of wafers from lowering, thereby the system can enhance the throughput.

The other components of this example are the same as those in the embodiment shown in FIG. 5, and accordingly, like reference numerals are used to denote like parts shown in FIG. 5 so as to avoid repeating the same explanation.

Figure 10:
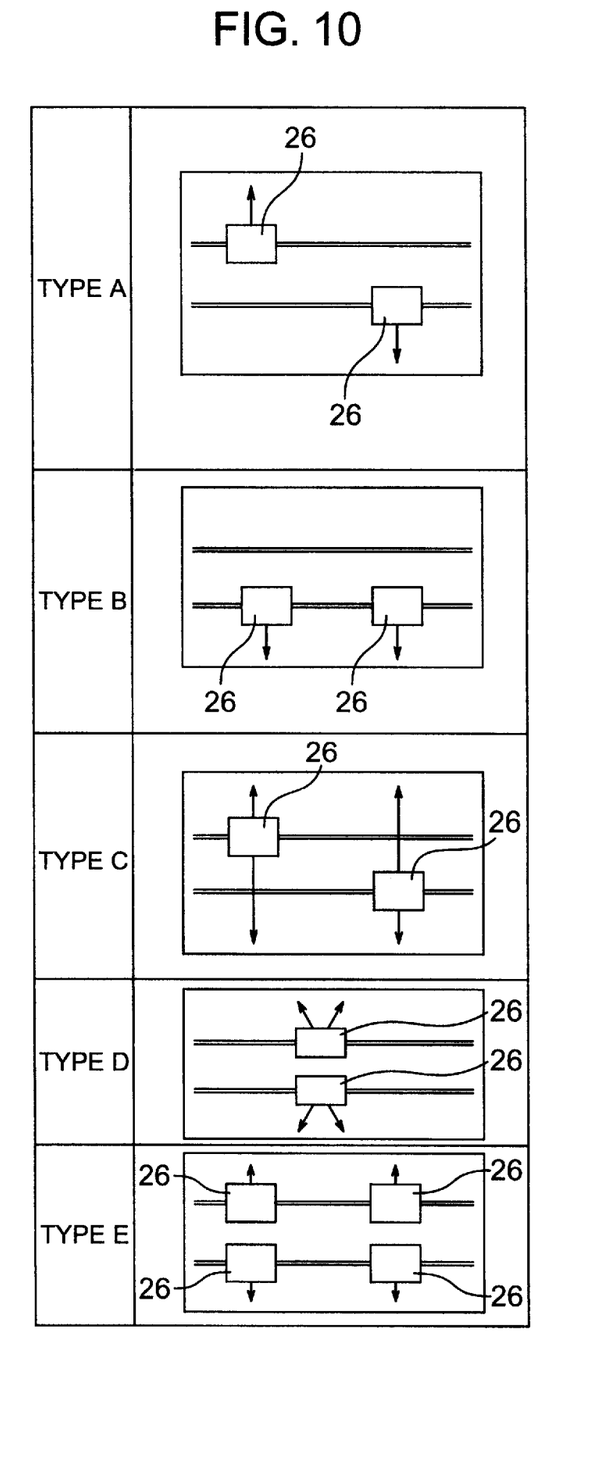
FIG. 10 is a view illustrating an example of conveyance of a wafer.

FIG. 10 shows the motions for transferring the wafers between the running robots and the devices in such a configuration that not less than two of running robots are used on a plurality of loop-like conveying paths as the loader conveying means, the motions are sorted in groups, type by type. Table 1 shows a configuration, a motion and an advantage per type.

The present invention can be applied to running robots which exhibits motions as given by Type A to Type E.

TABLE 1

| Type A | Running Robot: | A running robot is provided for each of rows of processing units, and the respective robots comprise arms for transferring wafers one by one to and from the lock chamber for each processing units. |
| | Transferring Wafer: | (1) Running robot moves and stops at a position corresponding to the lock chamber of each unit: <br> (2) The arm delivers a wafer into the lock chamber (introduction) or receives a wafer from the lock chamber (delivery) in the condition (1); <br> (3) The arm or the running robot which has been delivered or received the wafer moves to another position or place corresponding to a FOUP or a lock chamber of another processing unit; <br> (4) The control of operation of the respective running robots and the arms is independent from one another. |
| | Advantage: (Comparison | The introduction and delivery of wafers into rows of the processing units laid |

TABLE 1-continued

| | With Single Path/Single running Robot) | opposite sides can be smoothly since the degree of freedom of motion of the running robot is high. As a result, the conveyance of the wafers can be efficiently made so as to enhance the procutivity. |
| Type B | Running Robot Difference from Type A: | The same as that of type A Two running robots are moved in a line and in synchronization with each other. |
| | Transferring Wafer | (1) Two running robots moves and stops at positions corresponding to lock chambers (two chambers are arranged) of required processing units; <br> (2) In the condition (1), for example, the respective arms receives wafer from the associated lock chambers (introduction), and the left side arm moves in the direction indicated by the arrow in order to receive a wafer from another rock chamber; and <br> (3) The respective robots are controlled in relation to each other. |
| Type C | Running Robot: Difference from Type A: | The same as that of type A. The respective arms can transfer wafers to and from lock chambers of processing units in rows which are laid opposite sides of the running path. |
| | Transferring Wafer | (1) The respective running robots move and stop at positions which correspond to lock chambers of respective necessary processing units: and <br> (2) In the condition (1), the arms of the respective running robots transfer wafers to and from the lock chambers of the respective necessary processing units which are laid on opposite sides. |
| Type D | Running Root: Difference from Type A | The same as that of type A. The respective arms can transfer to and from lock chambers (two chambers) of the processing units. |
| | Transferring Wafer | (1) Running robots move and stop at positions corresponding to lock chambers (two chambers) of necessary processing units; and <br> (2) In the condition (1), the respective arms transfer wafers to and from the lock chambers (two chambers) of necessary processing units. |
| Type E | | Combination of Type A and Type B |

As mentioned above, according to the present invention, the concept of the peace processing sequence is applied among the processing units through the process modules, and accordingly, the process waiting time caused among the processing units during processing a lot of objects to be processed can be greatly reduced, thereby it is possible to greatly shortened the time from the introduction of a sample to the completion of the sample. Further, since each of the process modules is built up with a relatively small number of the processing units, the load upon the common atmospheric pressure peace conveying system can be greatly reduced, thereby it is possible to provide the system and the method which can restrain the through-put of each process module from lowering even on a mass production base. Further, since the conveyance is carried out between the process modules with the use of the mini-environment type object storage container such as a FOUP, the freedom of conveyance between the modules can be increased in comparison with such a system in which all lines are unified by through peace conveyance, thereby it is possible to rapidly and flexibly cope with various manufacturing processes.

It should be further understood by those skilled in the art that the foregoing description has been made on embodiments of the invention and that various changes and modifications may be made in the invention without departing from the spirit of the invention and the scope of the appended claims.

What is claimed is:

1. A wafer manufacturing system, the system providing with a conveyer device for conveying objects to be processed to a plurality of processing units which are arranged in a line, and each of which includes therein a conveying mechanism, through an atmospheric pressure space that is shielded from the atmospheric air, and provided therein with a purifying device, wherein the conveyer device comprises a loader conveying means which is laid along object transferring ports of the plurality of processing units, and which contains a running robot adapted to run so as to pass by not less than two of the object transferring ports, and which contains a transferring robot on the running robot for transferring an object to be processed from the running robot to the processing units through the transferring ports.

2. A wafer manufacturing system as set forth in claim 1, wherein a mini-environment type object storage container arranged in the atmospheric air, adjacent to the loader conveying means, and an atmospheric pressure space is defined in the mini-environment type object storage container having an object transferring port through which an object to be processed is carried into or out and from the atmospheric pressure space in the conveyer device by means of the transferring robot in the loader conveying means.

3. A wafer manufacturing system as set forth in claim 1, wherein the running robot can accommodate therein a plurality of objects to be processed.

4. A wafer manufacturing system as set forth in claim 1, wherein the conveyer device is adapted to transfer an object to be processed to and from the atmospheric pressure space through an object transferring port of a measuring device for measuring the object to be processed, by means of the loader conveying means or the transferring robot in the conveyer device.

5. A wafer manufacturing system as set forth in claim 1, wherein the loader conveying means is linearly arranged, and includes a buffer cassette arranged at each or one end part thereof, so as to hold, in an atmospheric pressure condition within the buffer cassette, an object to be processed adapted to be conveyed through a conveying path in the atmospheric pressure space, and the object to be processed is transferred to and from another loader conveying means or, to and from a conveying and transferring means in the conveyer device, through the buffer cassettes.

6. A wafer manufacturing system, the system comprising a plurality of processing units arranged in a line and each having therein a conveying mechanism, and a conveyer device for conveying objects to be processed to the processing units, wherein:

the conveyer device comprises loader conveying means laid along object transferring ports of the plurality of processing units arranged in a line, and across the object transferring ports of not less than two of the processing units, and a running robot adapted to run across not less than two of the object transferring ports, and a transferring robot for transferring an object to be processed from the running robot to the processing unit through the transferring port are arranged in the loader conveying means, other loader conveying means or conveying and transferring means are arranged in a direction orthogonal to the load conveying means arranged in a line in a plurality of systems;

the loader conveying means include a conveying robot and a buffer cassette arranged at one end thereof, the loader conveying means and the conveying and transferring means are shielded and provided with a purifying means so as to define an atmospheric pressure conveying path, and are arranged in the atmospheric air, and an object to be processed is transferred between the loader conveying means and between the loader conveying means and the conveying and transferring means through the buffer cassette.

7. A wafer manufacturing system as set forth in claim 6, wherein the plurality of processing units are arrange on both sides of the loader conveying means in the conveyer device.

* * * * *